United States Patent
McCordic et al.

(10) Patent No.: US 6,903,931 B2
(45) Date of Patent: Jun. 7, 2005

(54) COLD PLATE ASSEMBLY

(75) Inventors: Craig H. McCordic, Medfield, MA (US); Steven M. Lombardo, Sudbury, MA (US); Joseph R. Ellsworth, Worcester, MA (US)

(73) Assignee: Raytheon Company, Waltham, MA (US)

( * ) Notice: Subject to any disclaimer, the term of this patent is extended or adjusted under 35 U.S.C. 154(b) by 498 days.

(21) Appl. No.: 10/171,146

(22) Filed: Jun. 13, 2002

(65) Prior Publication Data

US 2003/0230400 A1 Dec. 18, 2003

(51) Int. Cl.[7] .............................................. H05K 7/20
(52) U.S. Cl. ...................... 361/711; 361/704; 361/707; 361/709; 257/707; 174/16.3; 165/80.3; 165/185
(58) Field of Search ................................ 361/688–690, 361/704–711, 715, 719–721; 257/706, 707; 174/16.1, 16.3; 165/80.3, 80.4, 185

(56) References Cited

U.S. PATENT DOCUMENTS

| | | | | |
|---|---|---|---|---|
| 5,255,738 A | * | 10/1993 | Przilas | 165/185 |
| 5,424,916 A | * | 6/1995 | Martin | 361/698 |
| 5,526,231 A | * | 6/1996 | Arz et al. | 361/707 |
| 5,960,861 A | * | 10/1999 | Price et al. | 165/80.3 |
| 6,075,701 A | | 6/2000 | Ali et al. | 361/704 |
| 6,400,570 B2 | * | 6/2002 | Schreffler | 361/704 |
| 6,411,512 B1 | * | 6/2002 | Mankaruse et al. | 361/700 |
| 6,462,410 B1 | * | 10/2002 | Novotny et al. | 257/707 |
| 2003/0131973 A1 | * | 7/2003 | Nair et al. | 165/104.33 |

* cited by examiner

Primary Examiner—Boris Chervinsky
(74) Attorney, Agent, or Firm—Iandiorio & Teska

(57) ABSTRACT

An edge cooled graphite core aluminum cold plate for use in phased array radar systems, the cold plate including opposing aluminum skins, and a core layer sandwiched between the opposing aluminum skins. The core layer includes graphite surrounded by an aluminum body. The aluminum body includes inwardly directed tabs extending from opposing cooled edges of the cold plate, the inwardly directed aluminum tabs having orifices therethrough. The opposing aluminum skins also includes orifices therethrough aligned with the orifices in the tabs of the aluminum body to reduce the conductivity of the cooled edges of the cold plate thus reducing the temperature gradient between edge mounted heat sources and inwardly mounted heat sources without adversely affecting the structural integrity of the graphite core layer.

32 Claims, 12 Drawing Sheets

COLD PLATE ASSEMBLY

FIELD OF THE INVENTION

This invention relates to a cold plate assembly and, in one example, to an edge cooled cold plate assembly for use in phased array radar systems.

BACKGROUND OF THE INVENTION

In some applications, it is not only important that heat sources such as integrated circuits be cooled, it is also important that the temperature gradient between any two heat sources be minimized. For example, one key parameter governing the radio frequency (RF) performance of a phased array radar system is the temperature gradient between heat sources, such as power amplifiers, in the transmit/receive (T/R) modules of the system. The power amplifiers in these T/R modules are mounted on a cold plate or heat sink which dissipates the heat from the power amplifiers. Because the distance from each power amplifier to the cooled edge of the cold plate varies, the power amplifiers which are located the greatest distance from the cooled edge of the cold plate (e.g., the interior mounted power amplifiers) operate at a higher temperature than the edge mounted power amplifiers.

But, in order to meet strict RF error tolerances, phased array radar designs require that any two power amplifiers operate within 4° C. of each other.

This requirement is due to the fact that the RF performance changes with temperature, with the gain changing approximately 0.1 dB/° C. and the phase changing approximately 0.8°/° C.

Typical prior art phased array systems employ liquid cooling of the cold plate with fluid couplings connected directly to the cold plate assembly of the transmit/receive integrated multichannel module (T/RIMM) to reduce the temperature gradient between power ampliers. Other prior systems attempt to reduce the temperature of the interior mounted heat sources by employing heat sinks with graphite and/or aluminum added to the heat sink which increases the thermal conductivity of the entire heat sink. See U.S. Pat. No. 6,075,701 incorporated herein in its entirety by this reference.

These prior art designs, however, exhibit several distinct disadvantages. Liquid cooling the cold plate requires fluid couplings which are prone to leak, are expensive, and have a high life cycle cost. Heat sinks or cold plates with added graphite and/or aluminum to increase the thermal conductivity of the heat sink or cold plate increase the size, weight, and cost of the device and moreover, do not meet the minimum temperature gradient requirements discussed above.

SUMMARY OF THE INVENTION

It is therefore an object of this invention to provide an improved cold plate assembly.

It is a further object of this invention to provide such a cold plate assembly which maintains interior and edge mounted heat sources mounted on the cold plate at approximately the same temperature.

It is a further object of this invention to provide, in one embodiment, such a cold plate assembly which maintains adjacent power amplifiers of a phased array radar system at approximately the same temperature.

It is a further object of this invention to provide such a cold plate assembly which eliminates the need for fluid couplings and fluid channels in the cold plate.

It is a further object of this invention to provide such a cold plate assembly which reduces the amount of graphite and/or aluminum needed in the cold plate to maintain edge mounted and interior mounted heat sources at approximately the same temperature.

It is a further object of this invention to provide such a cold plate assembly which is inexpensive and easy to fabricate.

This invention results from the realization that for some systems such as phased array radar systems which employ an edge cooled graphite core/aluminum cold plate with heat sources such as power amplifiers mounted thereon, the interior mounted power amplifiers will operate at a higher temperature than the edge mounted power amplifiers, but that the temperature gradient between the interior and edged mounted power amplifiers can be reduced to improve the performance of the system by tailoring the structure of the cold plate such that the portion of the cold plate proximate the edge mounted power amplifiers is less thermally conductive than the structure of the cold plate proximate the interior mounted power amplifiers thus, maintaining the edge mounted and interior mounted power amplifiers at approximately the same temperature.

This invention features an edge cooled graphite core aluminum cold plate for use in, inter alia, phased array radar systems. In one example, the cold plate includes opposing aluminum skins and a core layer sandwiched between the opposing aluminum skins. The core layer may include graphite surrounded by an aluminum body. The aluminum body includes inwardly directed tabs extending from the opposing cooled edges of the cold plate. Ideally, the inwardly directed aluminum tabs have orifices therethrough. The opposing aluminum skins typically also include orifices therethrough aligned with the orifices in the tabs of the aluminum body to reduce the conductivity of the cooled edges of the cold plate, thus reducing the temperature gradient between edge mounted heat sources and inwardly mounted heat sources without adversely affecting the structural integrity of the graphite core layer. In one embodiment the orifices in the tabs and the orifices in the skin layers are not filled with any material.

Ideally, the temperature gradient between the edge mounted heat sources and inwardly mounted heat sources is less than 4° C., i.e., 1.3° C. The edge cooled graphite core aluminum cold plate may also include two edge mounted heat sources and two inwardly mounted heat sources. Typically, the heat sources are power amplifiers.

This invention also features a phased array radar system, the system comprising a transmit/receive integrated multi-channel module including a cold plate and at least two cooling manifolds which receive the transmit/receive module. The cold plate typically includes opposing aluminum skins, edge mounted power amplifiers and inwardly mounted power amplifiers disposed on one of the opposing aluminum skins. A core layer may be sandwiched between the opposing aluminum skins. The core layer ideally includes graphite surrounded by an aluminum body. The aluminum body preferably includes inwardly directed tabs extending from opposing cooled edges of the cold plate, the inwardly directed aluminum tabs having orifices therethrough. The opposing aluminum skins may also include orifices therethrough aligned with the orifices in the tabs to reduce the thermal conductivity of the cooled edges of the cold plate, thus reducing the temperature gradient between edge mounted power amplifiers mounted and the inwardly mounted power amplifiers without adversely affecting the structural integrity of the graphite core layer.

Typically, the manifolds include channels therein which receive cooling fluid to reduce the temperature of the manifold. In one example, a plurality of manifolds receives an array of 700 transmit/receive integrated multichannel modules with at least four power amplifiers disposed on the cold plate of each module. In one example, the power amplifiers comprise a copper molybdenum package base secured to the cold plate by epoxy, a copper molybdenum spreader and solder. In one example, the phased array radar may further include an array plate configured to receive the array of transmit/receive integrated multichannel modules.

This invention also features a radio frequency head module assembly for a radar array comprising a cold plate having opposing skins, and a core layer sandwiched between the opposing aluminum skins. The core layer may include graphite surrounded by an aluminum body. The aluminum body may include inwardly directed tabs extending from opposing cooled edges of the cold plate. Preferably, the inwardly directed aluminum tabs having orifices therethrough. The opposing skins may also have orifices therethrough aligned with the orifices in the tabs to reduce the conductivity of the cooled edges of the cold plate thus reducing the temperature gradient between edge mounted heat sources and inwardly mounted heat sources without adversely effecting the structural integrity of the graphite core layer.

This invention also features a cold plate assembly cooled on at least one edge thereof comprising a plurality of heat sources mounted to a cold plate. A first heat source is typically located closer to a cooled edge of the cold plate than a second heat source. The structure of the cold plate below the first heat source is tailored to have less thermal conductivity than the structure of the cold plate below the second heat source. The cold plate may include opposing aluminum skin layer, and a core layer sandwiched between the opposing skin layers. The core layer may include graphite surrounded by an aluminum body. The aluminum body, in the preferred embodiment, includes at least one inwardly directed tab extending from a cooled edge of the cold plate. Ideally, the inwardly directed aluminum tab has an orifice therethrough. The opposing skins also may include cooled edge located orifices therethrough aligned with the orifice in the tabs to reduce the conductivity of the cooled edges of the cold plate, thus reducing the temperature gradient between the first heat source and the second heat source without adversely effecting the structural integrity of the graphite core layer.

In one design, the heat sink module assembly of this invention may include a plurality of heat sources and a heat sink tailored such that a region of the heat sink proximate the edges of the heat sink conducts less heat than the interior region of the heat sink. The region of the heat sink proximate the edges thereby cools heat sources disposed thereon less than heat sources disposed at the interior region of the heat sink to maintaining the heat sources disposed on the heat sink proximate the edges thereof at approximately the same temperature as the heat sources disposed on the interior region of the heat sink.

In a preferred embodiment, the heat sink module assembly may further include a high conductive core encapsulated between opposing skin layers to increase the thermal conductivity of the heat sink. Ideally, the high conductive core is graphite and the skin layers are made of aluminum, copper, or metal alloy. Alternatively, the high conductive core may be aluminum, copper or metal alloy. Preferably, the heat sink module assembly further includes at least one orifice proximate one the edges of the heat sink. The orifice may be tailored to further reduce the amount of heat dissipated from the edges of the heat sink thereby causing a heat source disposed thereon to operate at higher temperature. In one example, the heat sink module may include at least one inwardly directed tab extending from the edge of the heat sink, the inwardly directed tab may also have an orifice therethrough. Ideally, the inwardly directed tab and orifice are tailored to further reduce the amount of heat dissipated from the edge of the heat sink thereby causing a heat source disposed thereon to operate at higher temperature. Preferably, there are at least two orifices proximate at least two of the edges of the heat sink. At least one orifice may be surrounded by a region of graphite encapsulated by aluminum skins. The region of graphite core encapsulated by aluminum skins may be tailored to further reduce the amount of heat dissipated from the heat sources disposed proximate the edges of the heat sink. In the preferred embodiment, the plurality of heat sources are maintained at a temperature of within 1.3° C. of each other.

This invention further features a phased array radar system including a transmit/receive multichannel module, a heat sink module assembly including a plurality of heat sources, and at least two cooling manifolds which receive the transmit/receive multichannel module, and an array plate which receives the at least two manifolds. The heat sink is tailored such that a region of the heat sink proximate the edges of the heat sink conducts less heat than an interior region of the heat sink, thereby edge mounted cooling heat sources less than heat sources disposed at the interior region of the heat sink to maintain the heat sources disposed on the heat sink proximate the edges thereof at approximately the same temperature as the heat sources disposed on the interior region of the heat sink.

In other designs, the transmit/receive integrated multichannel module for use in phased array radar systems of this invention preferably includes a cold plate having opposing aluminum skins, edge mounted and inwardly mounted power amplifiers disposed on one skin, a core layer sandwiched between the opposing aluminum skins, the core layer including graphite surrounded by an aluminum body, the aluminum body including inwardly directed tabs extending from opposing cooled edges of the cold plate, the inwardly directed aluminum tabs having orifices therethrough. One opposing aluminum skin also includes cooled edge located orifices therethrough aligned with the orifices in the tabs to reduce the conductivity of the cooled edges of the cold plate thus reducing the temperature gradient between the edge mounted heat source and the inwardly mounted heat source without adversely effecting the structural integrity of the graphite core layer.

The transmit/receive integrated multichannel module may also includes a frame extending from the cold plate, the frame including a power/logic CCA mounted adjacent the control module, a DC/DC converter disposed adjacent to the power logic, an EMI filter CCA mounted on a distal end of the frame from the cold plate and adjacent to the DC/DC converter, an I/O connector connected to the EMI filter, and a plurality of cooling contacts on the frame.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 2:
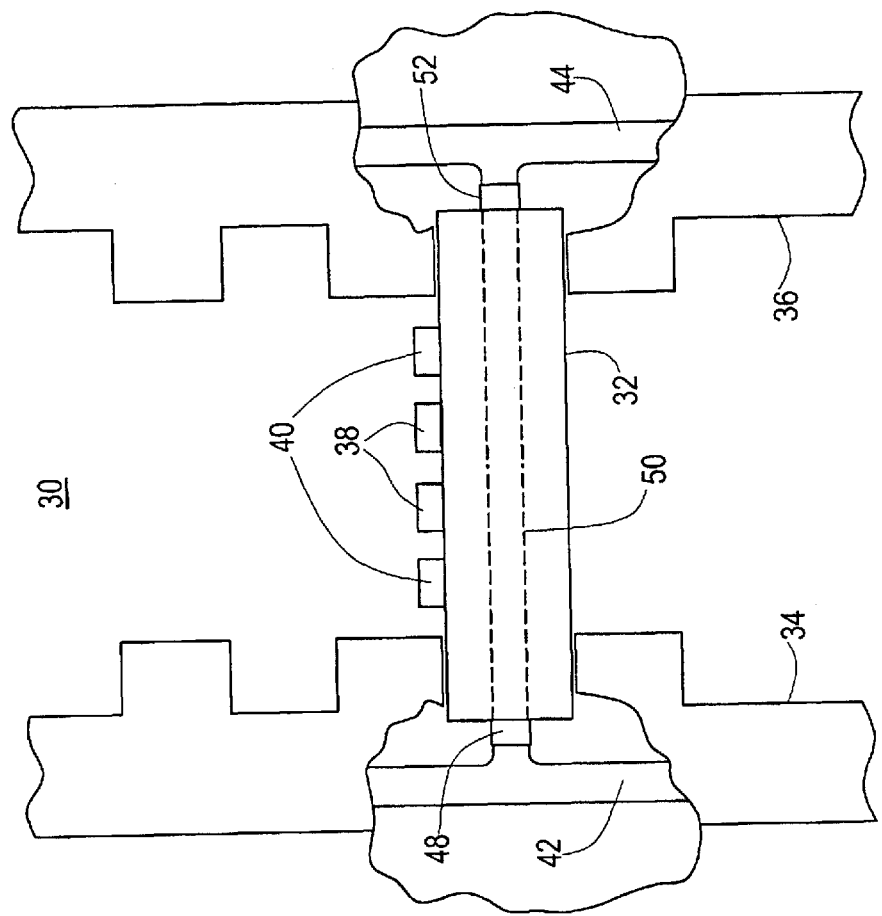
FIG. 2 is a schematic side view of a prior art T/R module used in phased array radar systems showing power amplifiers mounted on a cold plate, fluid couplings, fluid channels, and cooling manifolds.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Figure 1:
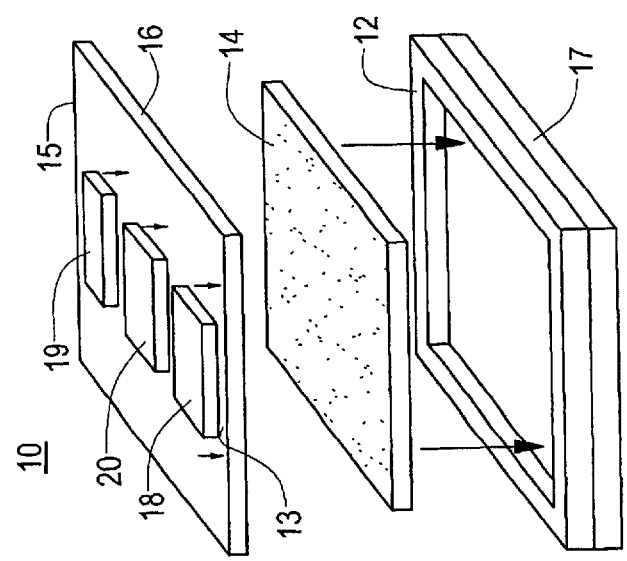
FIG. 1 is a schematic three-dimensional exploded view of one prior art cold plate assembly.

As explained in the Background section above, one key parameter governing the RF performance of a phased array radar system is the temperature gradient between heat sources, such as power amplifiers. Prior art cold plate 10, FIG. 1 is cooled on edges 13 and 15 typically by cooling manifolds (not shown). Cold plate 10 includes skins 16 and 17 and graphite core 14 which is embedded within aluminum body 12. Because high conductivity graphite core 14 extends throughout a substantial portion of aluminum body 12, the overall cooling efficiency of cold plate 10 is improved. However, this design does little to reduce the temperature gradient between edge mounted heat sources 18 and 19 and interior mounted heat source 20.

Another prior art design, also delineated in the Background section above, employs liquid cooling of a cold plate with fluid couplings connected directly to the cold plate assembly of a T/RIMM in an attempt to reduce the temperature gradient between the power amplifiers. Prior art assembly 30, FIG. 2 includes cold plate 32 disposed between cooling manifolds 34 and 36. In an attempt to reduce the temperature gradient between interior mounted heat sources 38 and edge mounted heat sources 40, this prior art design includes channels 42 and 44 in manifolds 34 and 36, respectively, with cooling fluid therein. The fluid enters cold plate 32 through fluid coupling 48, passes through channel 50 (shown in phantom) of cold plate 32, and exits via fluid coupling 52. Although this prior art design increases the cooling efficiency of cold plate 32, it does not reduce the temperate gradient between interior mounted heat sources 38 and edge mounted heat sources 40. Moreover, fluid couplings 48 and 52 are prone to leak, complex, and expensive.

In sharp contrast, the cold plate assembly of the subject invention includes a unique cold plate tailored such that the portion of the cold plate proximate the cooled edge mounted power amplifiers is less thermally conductive than the structure of the cold plate proximate the interior mounted power amplifiers. This results in a robust cold plate design that maintains the edge mounted and interior mounted power amplifiers at approximately the same temperature, thus dramatically improving the performance of the phased array radar system. Moreover, there is no need for fluid couplings or fluid channels in the cold plate.

Figure 3:
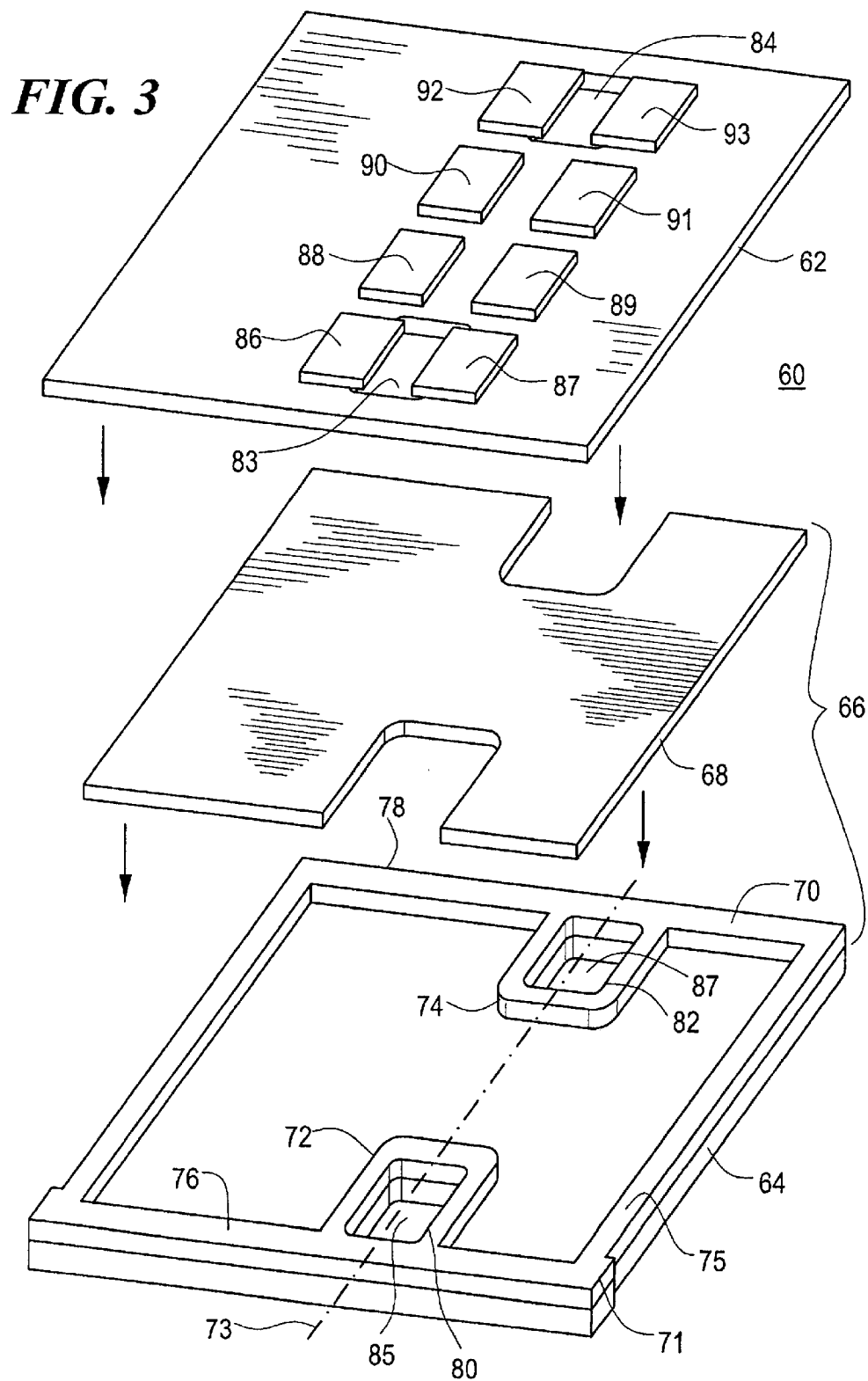
FIG. 3 is a schematic three-dimensional top view of one embodiment of the cold plate assembly of the subject invention.

Cold plate 60, FIG. 3, in one example of the subject invention, typically employed for use in phased array radar systems, includes opposing aluminum skins 62 and 64. Core layer 66 is sandwiched between opposing aluminum skins 62 and 64 and includes graphite layer 68, or another similar material with high thermal conductivity, surrounded by aluminum body 70 with inwardly directed tabs 72 and 74 extending from opposing cooled edges 76 and 78, respectively, of cold plate 60. Edges 76 and 78 are typically cooled conductively by opposing manifolds discussed infra. Inwardly directed tabs 72 and 74 typically include orifices 80 and 82, respectively, extending therethrough. Aluminum skin 62 also includes orifices 83 and 84 extending therethrough which are aligned with orifices 80 and 82, respectively, in tabs 72 and 74 of aluminum body 70. Aluminum skin layer 64 also includes orifices 85 and 87 extending therethrough which are similarly aligned with orifices 80 and 82 in tabs 72 and 74, respectively.

The purpose of this design is to cool all the heat sources, such as power amplifiers 86–93 mounted on skin layer 62 and to minimize the temperature gradient between a) edge mounted amplifiers 86, 87 and 92, 93 and b) interior mounted amplifiers 88, 89, and 90, 91. In this example, there is less high thermally conductive graphite beneath edge mounted amplifiers 86, 87 and 92, 93 than beneath interior mounted amplifiers 88, 89 and 90, 91 due to tabs 72 and 74 extending inwardly from cooled edges 76 and 78 of cold plate 60. The result is that edge mounted amplifiers 86, 87 and 92, 93 are cooled, but less efficiently than interior mounted amplifiers 88, 89 and 90, 91. Moreover, the presence of orifices 80 and 82 in tabs 72 and 74, orifices 83 and 84 in top aluminum skin 62, and orifices 85 and 87 in bottom aluminum skin 64 also reduces the cooling efficiency of cold plate 60 at the region where edge mounted amplifiers 86, 87 and 92, 93 are mounted keeping them cool but at approximately the same temperature, or within at least 4° C., of interior mounted amplifiers 88, 89 and 90, 91. Stated conversely, the graphite beneath interior mounted amplifiers 88, 89 and 90, 91 cools them more efficiently than the lack of graphite beneath edge mounted amplifiers 86, 87 and 92, 93 but, these amplifiers benefit from increased cooling due to their proximity to cooled edges 76 and 78 of cold plate 60. At the same time, aluminum body 70 and tabs 72 and 74 ensure that the structural integrity of graphite core layer 68 is maintained. The result of maintaining the edge mounted power amplifiers and interior mounted power amplifiers at approximately the same temperature is that the performance of the phased array radar system is improved. Although, as shown in FIG. 3, opposing aluminum skins 62 and 64 and aluminum body 70 are made of aluminum, these are not necessary limitations of the invention as the skin layers and body may be made of copper or other metal or alloy. Moreover, the orifices 80, 82 in tabs 72, 74 and the corresponding orifices 83, 84, 85 and 87 in skin layers 62 and 64 may be filled with material, but typically are left open.

In one embodiment of this invention, there may be only a single tab with an orifice therethrough which is aligned with orifices in the top bottom skins, and only one cooled edge on the cold plate. In addition, the tab does not need to be attached to the aluminum body and may be incapsulated by graphite.

In one example of the subject invention a heat sink is tailored such that a region of the heat sink proximate the edges of the heat sink conducts less heat than an interior region of the heat sink. The result is that the region of the heat sink proximate the edges cools heat sources disposed thereon less than heat sources disposed at the interior region of the heat sink, thus maintaining the heat sources disposed on the heat sink proximate the edges thereof at approximately the same temperature as the heat sources disposed on the interior region of the heat sink.

Cold plate 60 in accordance with the subject invention may used in a phased array radar system and uniquely maintains a temperature gradient between edge mounted heat sources 86, 87 and 92, 93 and inwardly mounted heat sources 88, 89 and 90, 91 of less than or equal to 4° C. In practice, the temperature gradient between the edge mounted heat sources and the inwardly mounted heat sources was found to be less than or equal to 1.3° C. Typically, there are two sets of edge mounted heat sources and two inwardly mounted heat sources disposed on aluminum skin 62 of cold plate 60. In the preferred embodiment, the heat sources are power amplifiers.

Figure 4:
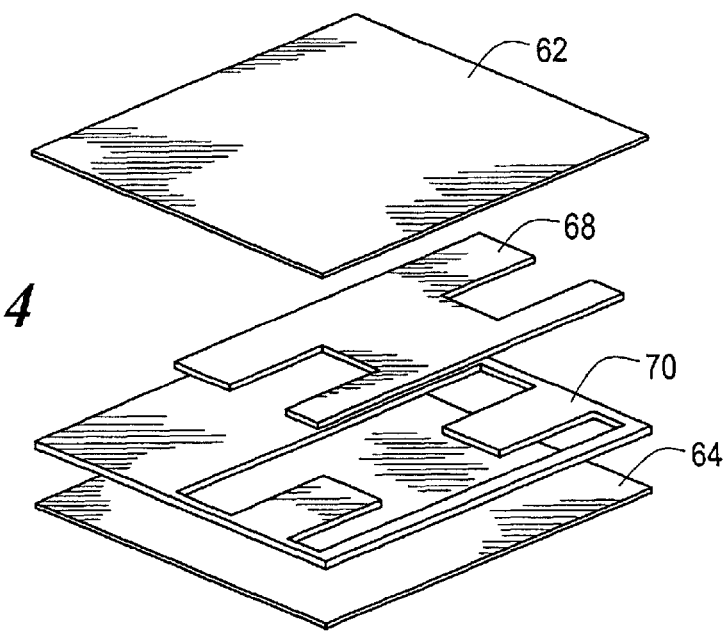
FIG. 4 is a schematic three-dimensional view showing the aluminum skins, graphite core, and aluminum body of the cold plate assembly shown in FIG. 3 prior to diffusion bonding and machining.

Cold plate 60, FIG. 3 is manufactured by high pressure diffusion bonding of aluminum skins 62 and 64, as shown in FIG. 4 with aluminum body 70 and graphite core 68 sandwiched therebetween. The high pressure diffusion bonding efficiently bonds aluminum skins 62 and 64 to aluminum body 70 and embeds graphite core 68 therebetween. After the high pressure diffusion bonding is complete, the assembled cold plate is machined to form orifices 83, 84, and 85, 87, FIG. 3 in aluminum skins 62 and 64, respectively, and to form orifices 80 and 82 in tabs 72 and 74 of aluminum body 70.

Figure 5:
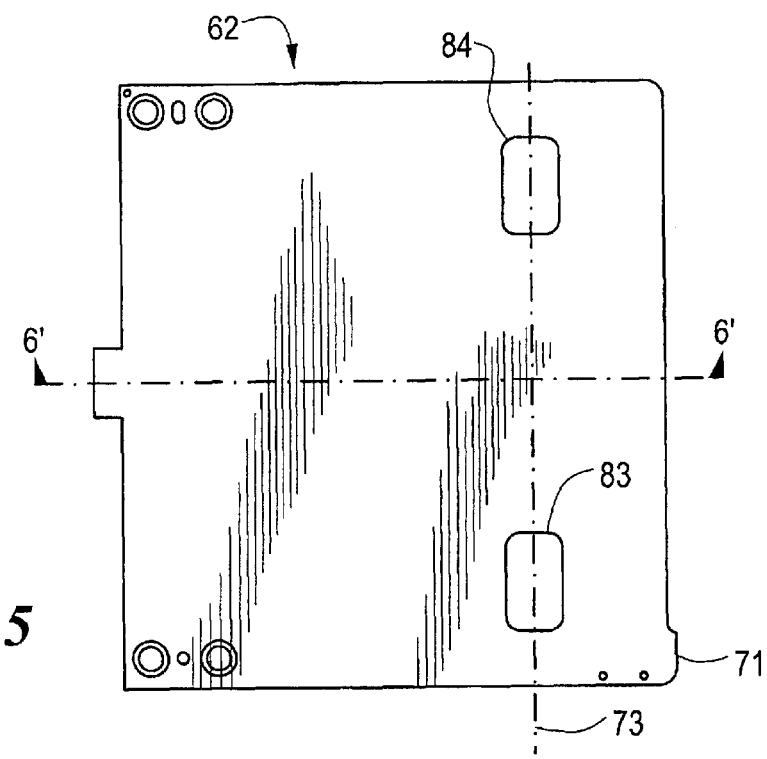
FIG. 5 is a schematic top view of the cold plate assembly shown in FIG. 3.
Figure 6:
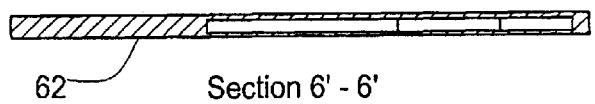
FIG. 6 is cross-sectional side view of the cold plate assembly shown in FIG. 5 taken along line 6—6.

A top view of aluminum skin layer 62 is shown in FIG. 5. In one preferred embodiment, aluminum skin 62, and opposing skin 64 (not shown) are 3.285 inches in length by 3.510 inches in width. Orifices 83 and 84 are typically 0.338 inches in length and 0.573 inches in width and located on centerline 73, FIG. 5, 0.854 inches from edge 71 respectively of aluminum skin 62. Orifices 85 and 87 (not shown) of skin 64 have similar dimensions and locations. The thickness of aluminum skin 62, FIG. 6 is preferably 0.0225 inches. Skin 64, FIG. 3 is similarly 0.0225 inches thick. Although the dimensions of skins and orifices shown in FIGS. 5 and 6 are used in a preferred embodiment, these dimensions are not necessary limitations of the invention, as the dimensions of skins, the orifices, and the thickness of skins may vary according to various requirements of the cold plate.

Figure 7:
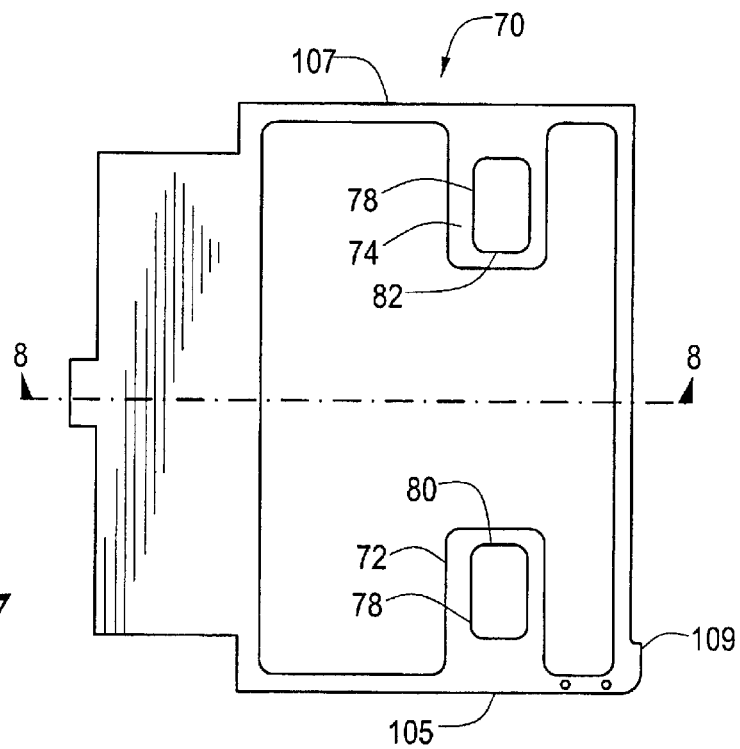
FIG. 7 is a schematic top view of the aluminum body of the cold plate assembly shown in FIG. 3.
Figure 8:
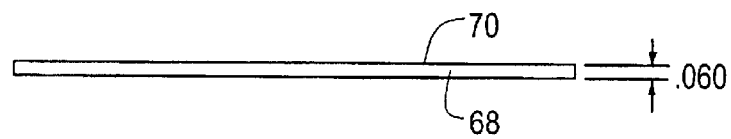
FIG. 8 is cross-sectional side view of the aluminum body of FIG. 7 taken along line 8—8.

Aluminum body 70, FIG. 7 is typically 3.285 inches in length by 3.460 inches in width. Inwardly directed tabs 72 and 74 preferably begin 0.574 inches from edge 109 and end 1.181 inches from edge 109. Inwardly directed tabs 72 and 74 extend inwardly 0.998 inches from edges 105 and 107, respectively. As shown in FIG. 8, taken along line 8—8 of FIG. 7, aluminum body 70 is, in one example, 0.060 inches thick.

Figure 9:
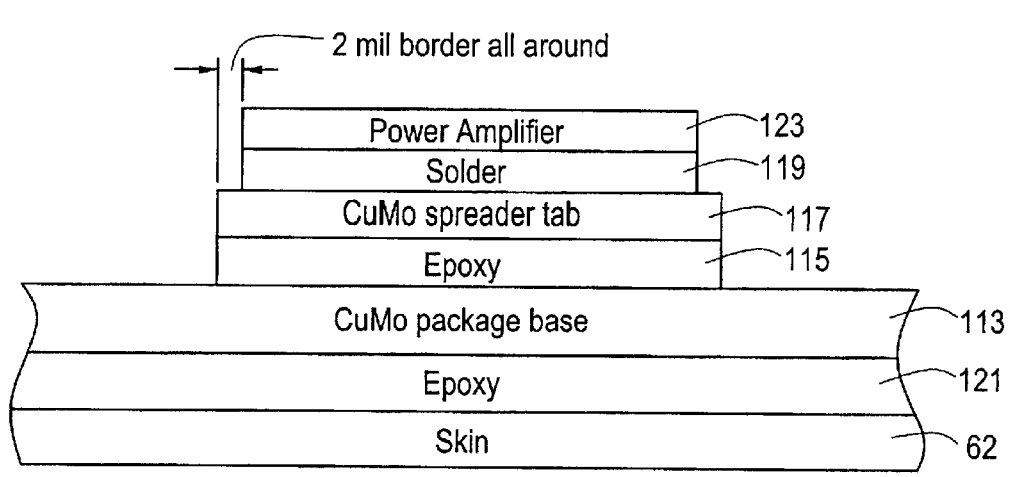
FIG. 9 is a schematic side view showing the material stack-up used to secure power amplifiers to the cold plate assembly shown in FIG. 3.

In a preferred example, the power amplifiers comprise composite copper molybdenum package 113, FIG. 9 secured to aluminum skin 62 by epoxy 121, such as 5 mils of EFC-561E epoxy. Epoxy 115, ideally H35-175 epoxy, secures copper molybdenum spreader 117 to copper molybdenum package 113. Solder 119, such as gold tin solder, secures power amplifier 123 to the copper molybdenum spreader 117.

Figure 10:
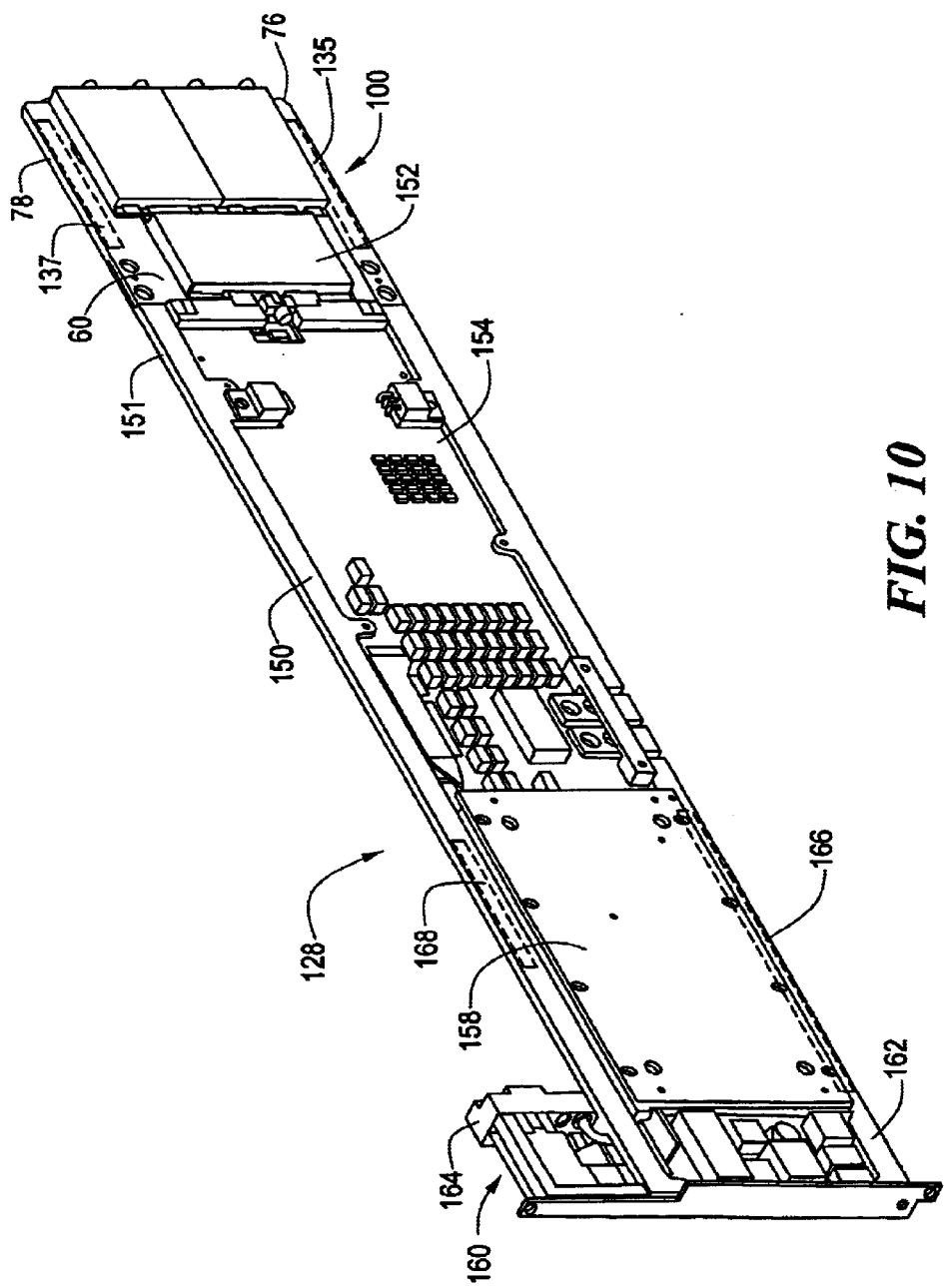
FIG. 10 is a schematic three-dimensional top view of one embodiment of a transmit/receive integrated multichannel module (T/RIMM) in accordance with the subject invention showing the cold plate assembly and other various components of the module.
Figure 11:
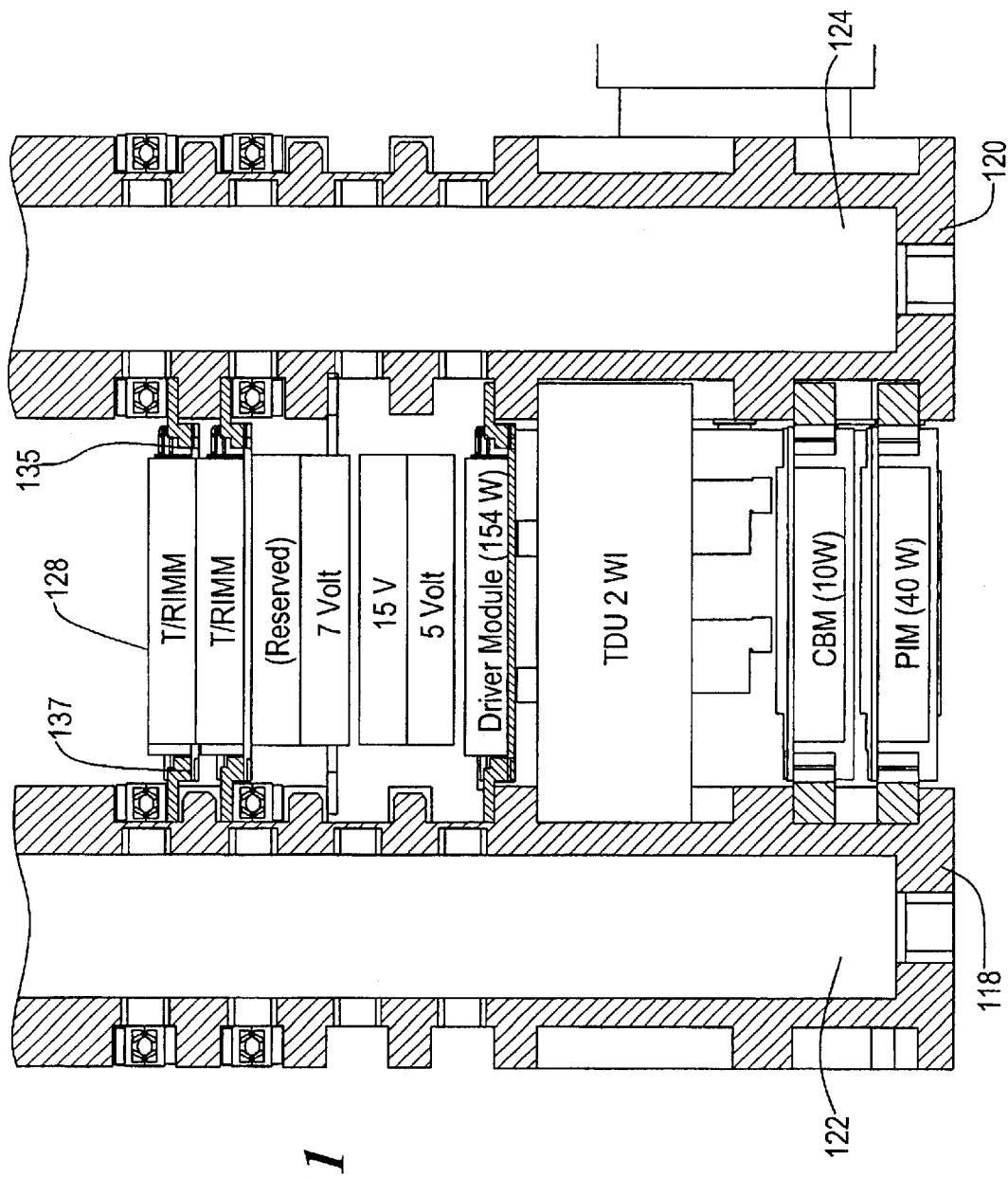
FIG. 11 is a schematic side view of a phased array radar system including a T/RIMM mounted between two cooling manifolds in accordance with the subject invention.
Figure 12:
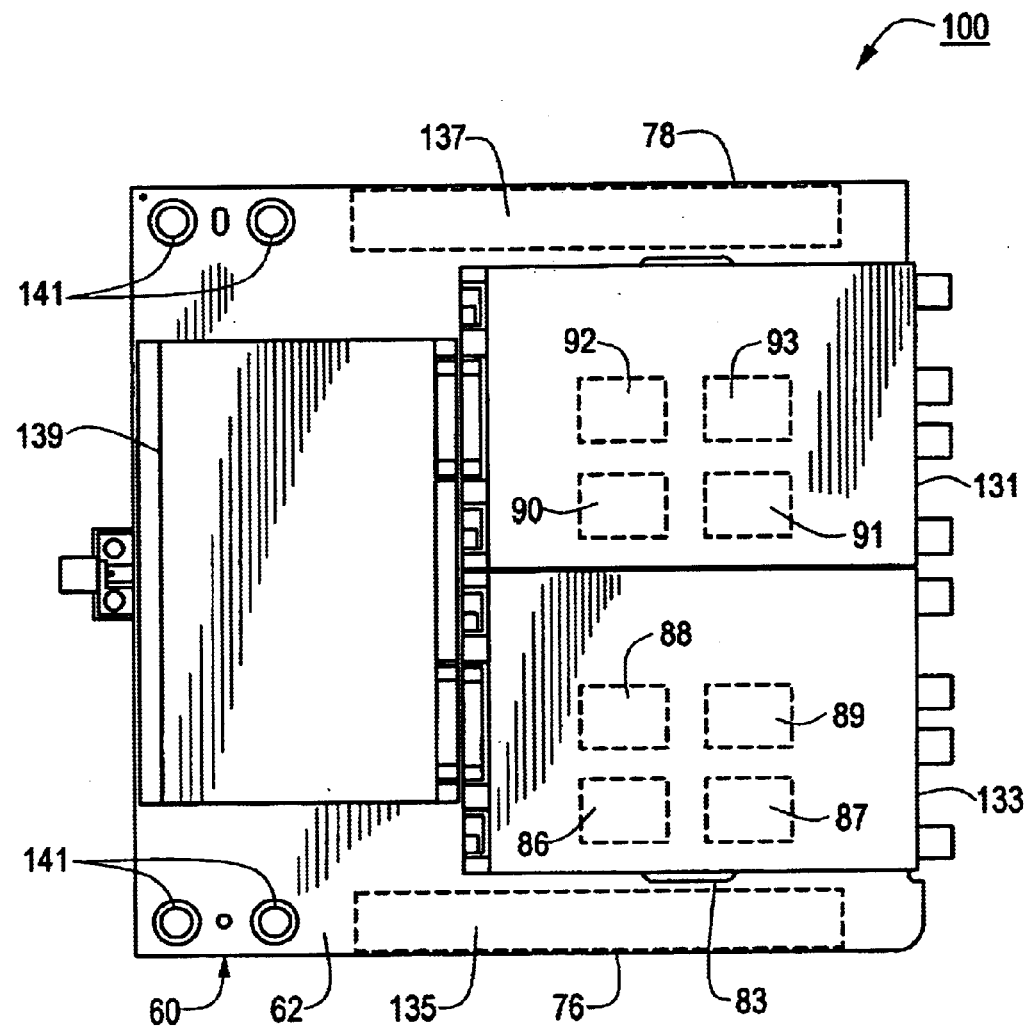
FIG. 12 is schematic top view of the cold plate assembly shown in FIG. 10.
Figure 13:
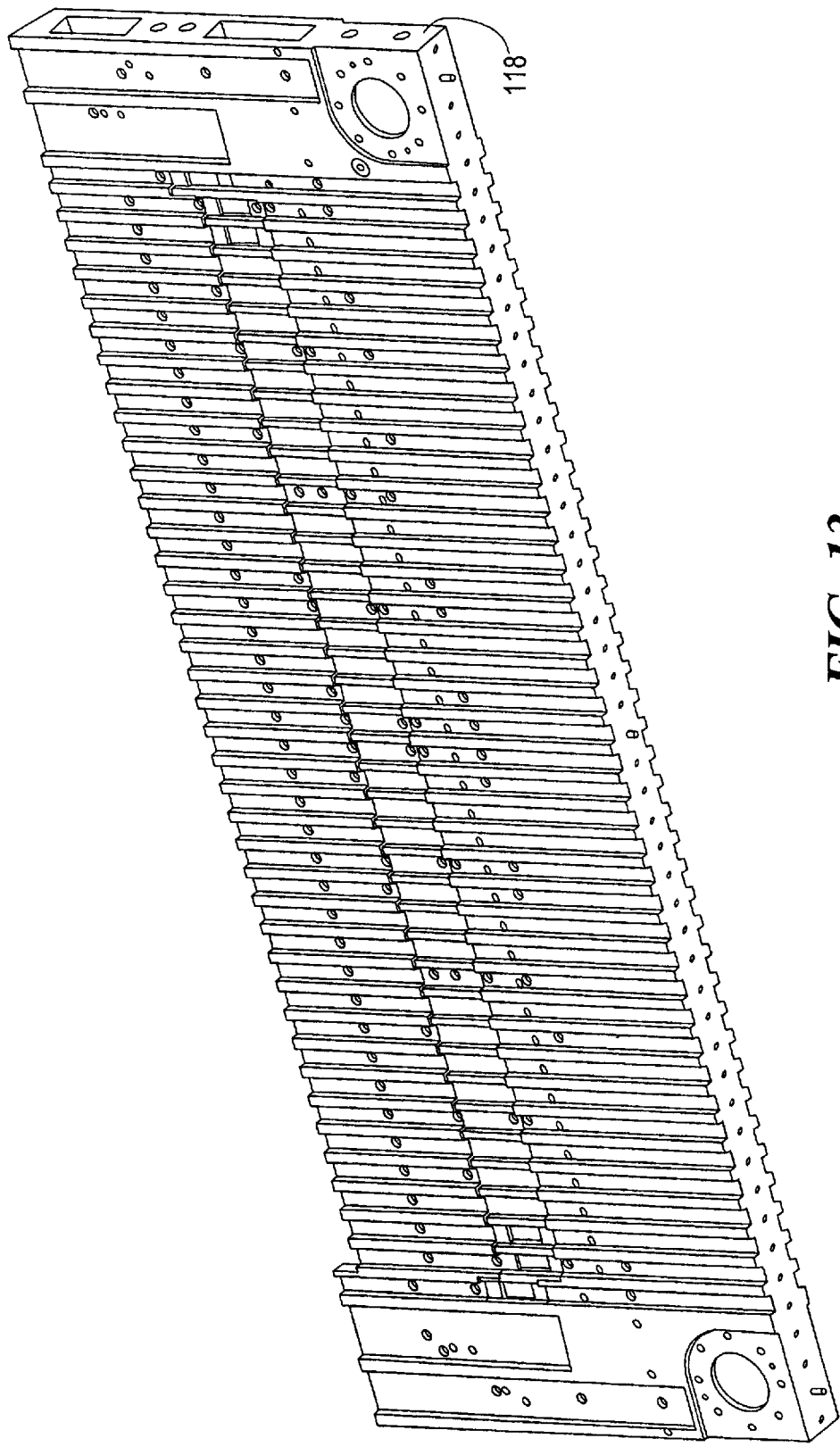
FIG. 13 is a schematic three-dimensional top view of the cooling manifold used to cool the edges of the cold plate assembly of the T/R module shown in FIG. 12.

In a phased array radar system, T/RIMM module 128, FIG. 10 is received by cooling manifolds 118 and 120, FIG. 11. T/RIMM 128 is mounted between manifolds 118 and 120 which include channels 122 and 124, respectively, with cooled fluid therein which provides cooling to contacts 135 and 137, FIG. 10 of cold plate assembly 100 mounted to T/RIMM 128. Cooled contacts 135 and 137 conductively cool edges 76 and 78 of cold plate 60 (also shown in FIG. 3). A more detailed view of cooling contacts 135 and 137, edges 76 and 78, cold plate 60, and cold plate assembly 100 is shown in FIG. 12. An example of one embodiment of one of the manifolds, such as manifold 118 is shown in greater detail in FIG. 13.

Unlike prior art phased array radar systems which employ T/RIMM that require fluid couplings to channel cooled fluid through the cold plate, the T/RIMM of the subject invention employs a unique cold plate design, as discussed supra, which maintains edge mounted and interior mounted power amplifiers at approximately the same temperature without the need for complicated and expensive fluid channels and couplings which are prone to leak.

T/RIMM 128, FIG. 10, in one example in accordance with the subject invention, includes cold plate assembly 100 mounted on end 151 of frame 150. T/RIMM 128 also includes power/logic circuit board CCA 154 mounted on frame 150 adjacent to control module 152 of cold plate assembly 100. T/RIMM 128 further includes DC/DC converter 158 mounted on frame 150 adjacent to power/logic circuit board 154, and EMI filter 160 attached on end 162 of frame 150 which includes I/O connector 164. T/RIMM 128 also includes additional cooling contacts 166 and 168 which provide cooling for DC/DC converter 158 when attached to cooling manifolds (not shown).

Cold plate assembly 100, FIG. 12 of the subject invention, also known as a radio frequency head, includes cold plate 60

(as previously described) with edge mounted power amplifiers 86, 87 and 92, 93 (shown in phantom) and interior mounted power amplifiers 88, 89 and 90, 91 (also shown in phantom) mounted on skin 62. Ideally, there are two PA/LNA modules 131 and 133, each having at least four power amplifiers therein which are maintained at approximately the same temperature by cold plate 60 as described above. Cold plate assembly 100 further includes control module 139 which is mounted on skin 62 of cold plate 60 proximate modules 131 and 133. Cold plate assembly 100 also includes rivet holes 141 extending through cold plate assembly 100 which provide attachment to frame 150, FIG. 10 of T/RIMM module 128.

Figure 14:
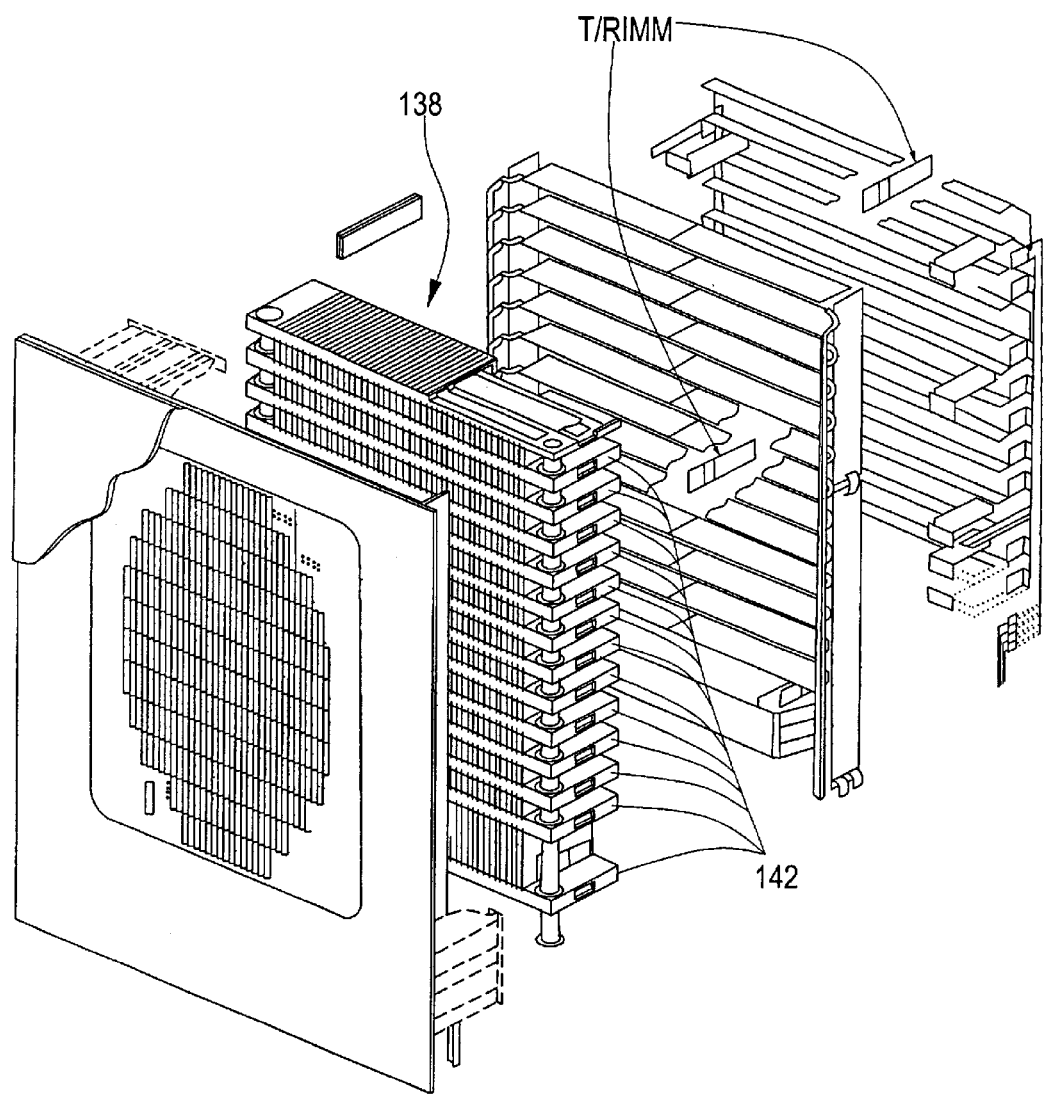
FIG. 14 is a schematic three-dimensional top view of the phased array radar system in accordance with the subject invention showing an array plate receiving an array of T/RIMMs disposed between the cooling manifolds.
Figure 15:
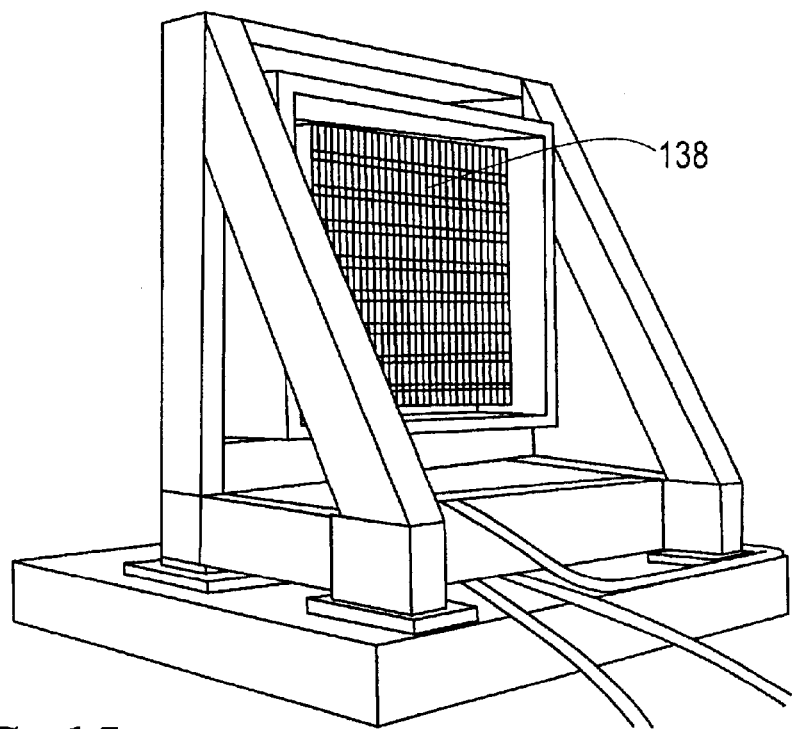
FIG. 15 is a schematic three-dimensional side view of one embodiment of the T/RIMM based phased array radar system in accordance with the subject invention.
Figure 16:
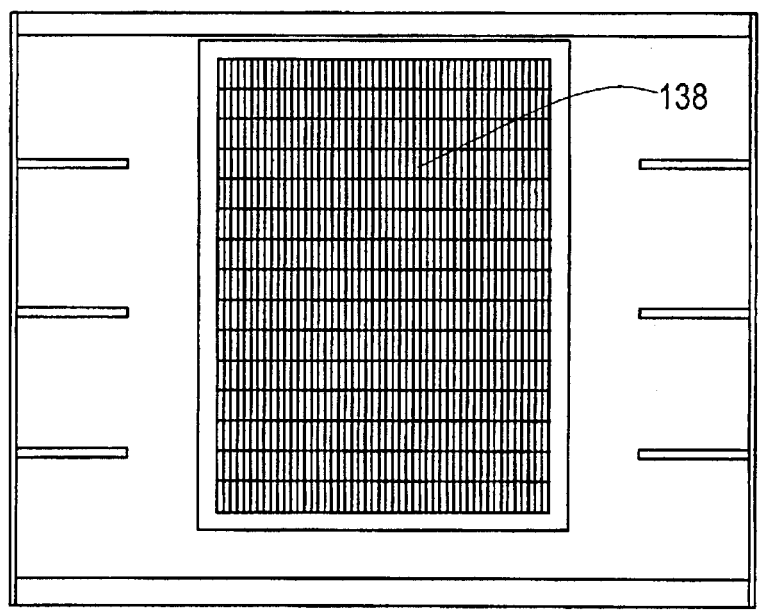
FIG. 16 is a schematic three-dimensional front view of another embodiment of the T/RIMM based radar array system in accordance with the subject invention.

A phased array radar system, in accordance with this invention, includes array 138, FIG. 14 of T/RIMMs mounted between plurality of cooling manifolds 142. Array 138 may include seven hundred T/RIMMs. Typically, array plate 140 receives array 138 and plurality of cooling manifolds 142. Examples showing the phased array radar system of the subject invention during environmental testing are shown in FIGS. 15 and 16.

Figure 17:
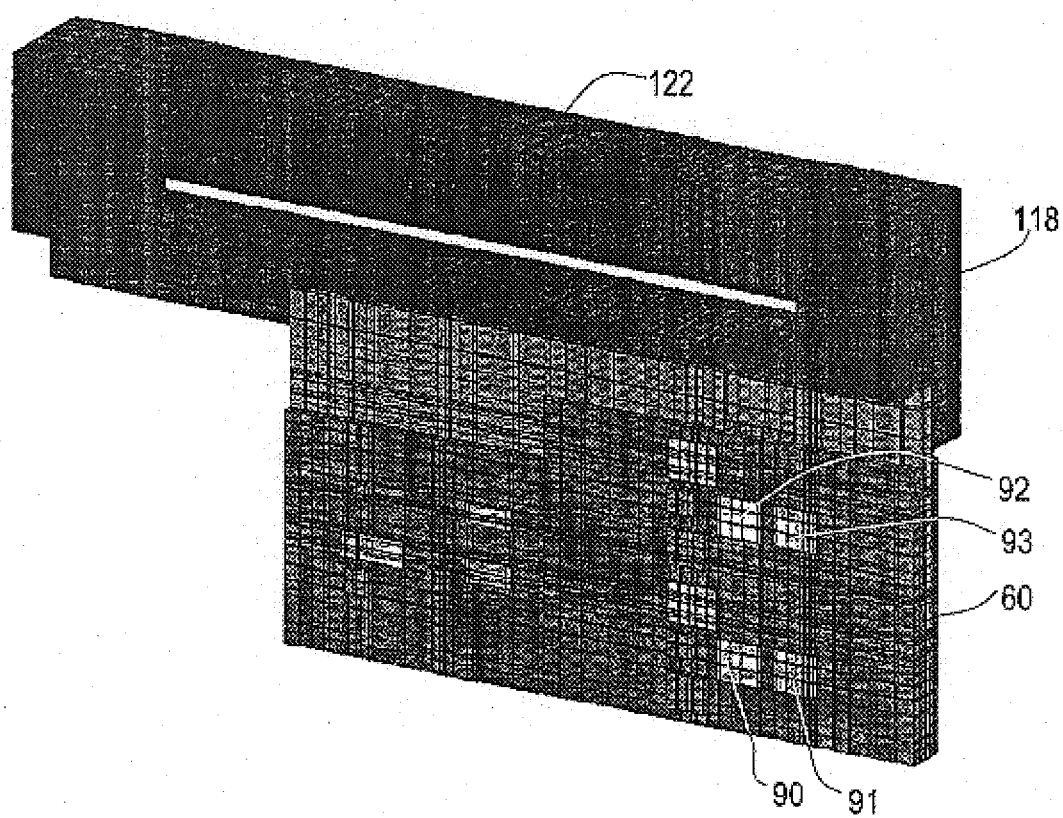
FIG. 17 is a thermal model of the cold plate assembly of the subject invention showing the locations of four power amplifiers mounted on the cold plate and a cooling manifold.
Figure 18:
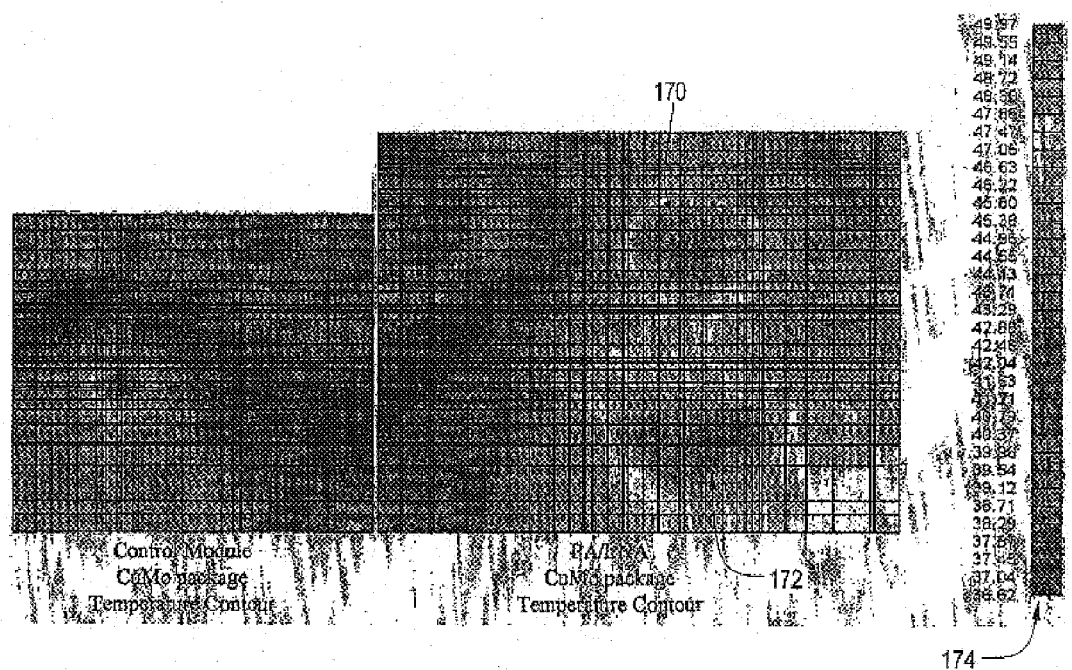
FIG. 18 is a computer simulation showing the temperature gradient between the power amplifiers shown in FIG. 17.

FIG. 17 is a thermal model of cold plate 60 of this invention showing the locations of edge mounted power amplifiers 92 and 93 and interior mounted power amplifiers 90 and 91 mounted on cold plate 60 and cooling manifold 118 with cooling channel 122. The results from a computer simulation of the operation of the thermal model shown in FIG. 17 in a phased array radar system is shown in FIG. 18. As can be seen from the simulation, the heat dissipated by edge mounted power amplifiers 92 and 93, indicted by arrow 170 and shown on thermal index 174, and the heat dissipated by interior mounted power amplifiers 90 and 91, indicated by arrow 172 and shown in thermal index 174 is approximately the same, indicating edge mounted power amplifiers 92 and 93 and inwardly mounted power amplifiers 90 and 91 operate at approximately the same temperature.

Thus, the cold plate assembly of the subject invention maintains interior mounted power amplifiers and edge mounted power amplifiers at approximately the same temperature while at the same time provides efficient and effective cooling of the power amplifiers. By reducing the temperature gradient between interior mounted power amplifiers and edge mounted power amplifiers, the overall performance of a phased array radar system is significantly improved. The robust design of cold plate of the subject invention eliminates the need for fluid cooling of the cold plate which requires fluid couplings that are prone to leak and are expensive. Moreover, by tailoring the cold plate to reduce the thermal conductivity of the cold plate proximate the cooled edges by reducing the amount of graphite and/or aluminum proximate the edges of the cold plate, the robust design reduces the weight and cost of the cold plate assembly.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An edge cooled graphite core aluminum cold plate for use in phased array radar systems, the cold plate including: opposing aluminum skins; and
    a core layer sandwiched between the opposing aluminum skins,
        the core layer including graphite surrounded by an aluminum body,
            the aluminum body including inwardly directed tabs extending from opposing cooled edges of the cold plate,
                the inwardly directed aluminum tabs having orifices therethrough,
    the opposing aluminum skins also having orifices therethrough aligned with the orifices in the tabs of the aluminum body to reduce the conductivity of the cooled edges of the cold plate thus reducing the temperature gradient between edge mounted heat sources and inwardly mounted heat sources without adversely affecting the structural integrity of the core layer.

2. The edge cooled graphite core aluminum cold plate of claim 1 in which the orifices in the tabs and the orifices in the opposing aluminum skins are not filled with any material.

3. The edge cooled graphite core aluminum cold plate of claim 1 in which the temperature gradient between the edge mounted heat sources and inwardly mounted heat sources is less than or equal to 4° C.

4. The edge cooled graphite core aluminum cold plate of claim 1 in which the temperature gradient between the edge mounted heat sources and inwardly mounted heat sources is less than or equal to 1.3° C.

5. The edge cooled graphite core aluminum cold plate of claim 1 in which there are two edge mounted heat sources and two inwardly mounted heat sources.

6. The edge cooled graphite core aluminum cold plate of claim 1 in which the heat sources are power amplifiers.

7. A phased array radar system, the system comprising:
    a transmit/receive integrated multichannel module including a cold plate comprising:
        opposing aluminum skins;
        edge mounted power amplifiers and inwardly mounted power amplifiers disposed on one said skin,
        a core layer sandwiched between the opposing aluminum skins, the core layer including graphite surrounded by an aluminum body, the aluminum body including inwardly directed tabs extending from opposing cooled edges of the cold plate, the inwardly directed aluminum tabs having orifices therethrough,
        the opposing aluminum skins also having orifices therethrough aligned with the orifices in the tabs to reduce the conductivity of the cooled edges of the cold plate thus reducing the temperature gradient between the edge mounted power amplifier and the inwardly mounted power amplifiers without adversely affecting the structural integrity of the graphite core layer; and
    at least two cooling manifolds which receive the transmit/receive module.

8. The phased array radar system of claim 7 in which the manifolds include channels therein which receive cooling fluid to reduce the temperature of the manifold.

9. The phased array radar system of claim 8 in which a plurality of manifolds receives an array of transmit/receive integrated multichannel modules.

10. The phased array radar system of claim 9 in which the array of transmit/receive integrated multichannel modules is at least 700 modules.

11. The phased array radar system of claim 10 in which each transmit/receive integrated multichannel module includes at least four power amplifiers disposed on the cold plate.

12. The phased array radar system of claim 11 in which the power amplifiers comprise a copper molybdenum package base secured to the cold plate by epoxy, a copper molybdenum spreader, and solder.

13. The phased array radar system of claim 10 further including an array plate configured to receive the array of transmit/receive integrated multichannel modules.

14. A radio frequency head module assembly for a radar array comprising:
a cold plate having opposing aluminum skins; and
a core layer sandwiched between the opposing aluminum skins, the core layer including graphite surrounded by an aluminum body, the aluminum body including inwardly directed tabs extending from opposing cooled edges of the cold plate, the inwardly directed aluminum tabs having orifices therethrough,
the opposing aluminum skins also having orifices therethrough aligned with the orifices in the tabs to reduce the conductivity of the cooled edges of the cold plate thus reducing the temperature gradient between edge mounted heat sources and inwardly mounted heat sources without adversely effecting the structural integrity of the graphite core layer.

15. The radio frequency head module of claim 14 in which there are at least four heat sources disposed on the cold plate.

16. The radio frequency head module of claim 15 in which the heat sources are power amplifiers.

17. A cold plate assembly cooled on at least one edge thereof comprising:
a plurality of heat sources mounted to a cold plate and required to have a minimal temperature gradient, at least a first said heat source located closer to a cooled edge of the cold plate than at least a second said heat source; and
the structure of the cold plate below the first said heat source tailored to have less thermal conductivity than the structure of the cold plate below the second said heat source.

18. The cold plate assembly of claim 17 in which the cold plate includes:
opposing aluminum skin layers; and
a core layer sandwiched between the opposing skin layers, the core layer including graphite surrounded by an aluminum body, the aluminum body including at least one inwardly directed tab extending from a cooled edge of the cold plate, the inwardly directed tab having an orifice therethrough, the opposing aluminum skins also having cooled edge located orifices therethrough aligned with the orifice in the tab to reduce the conductivity of the cooled edges of the cold plate thus reducing the temperature gradient between said first said heat source and second said heat source without adversely effecting the structural integrity of the graphite core layer.

19. A heat sink module assembly comprising:
a plurality of heat sources; and
a heat sink tailored such that a region of the heat sink proximate the edges of the heat sink conducts less heat than an interior region of the heat sink, said region of the heat sink proximate the edges thereby cooling heat sources disposed thereon less than heat sources disposed at the interior region of the heat sink, thus maintaining the heat sources disposed on the heat sink proximate the edges thereof at approximately the same temperature as the heat sources disposed on the interior region of the heat sink.

20. The heat sink module assembly of claim 19 in which said heat sink further includes a high conductive core encapsulated between opposing skin layers to increase the thermal conductivity of the heat sink.

21. The heat sink module assembly of claim 20 in which said high conductive core is graphite.

22. The heat sink module assembly of claim 19 in which said high conductive core and said opposing skin layers are made of aluminum.

23. The heat sink module assembly of claim 19 in which said high conductive core and said opposing skin layers are made of copper.

24. The heat sink module assembly of claim 19 in which said high conductive core and said opposing skin layers are made of a metal alloy.

25. The heat sink module assembly of claim 19 in which the heat sink further includes at least one orifice proximate one of the edges of said heat sink, the orifice tailored to reduce the amount of heat dissipated from the edges of the heat sink thereby causing the heat source disposed thereon to operate at higher temperature.

26. The heat sink module assembly of claim 19 in which the heat sink further includes at least one inwardly directed tab extending from the edge of the heat sink, the inwardly directed tab having an orifice therethrough, the inwardly directed tab and orifice tailored to further reduce the amount of heat dissipated from the edge of the heat sink thereby causing a heat source disposed thereon to operate at higher temperature.

27. The heat sink module assembly of claim 25 in which the heat sink further includes at least two orifices proximate at least two of the edges of the heat sink.

28. The heat sink module of claim 25 in which said at least one orifice is surrounded by a region of graphite encapsulated by aluminum skins, said region of graphite core encapsulated by aluminum skins tailored to further reduce the amount of heat dissipated from the heat sources disposed proximate the edges of the heat sink.

29. The heat sink module assembly of claim 19 in which said plurality of heat sources are maintained at a temperature of within 1.3° C. of each other.

30. The heat sink module of claim 19 in which said plurality of heat sources are maintained at a temperature of within 4° C. of each other.

31. A phased array radar system, the system comprising:
a transmit/receive multichannel module, the module including:
a heat sink module assembly including:
a plurality of heat sources;
a heat sink tailored such that a region of the heat sink proximate the edges of the heat sink conducts less heat than an interior region of the heat sink, said region of the heat sink proximate the edges thereby cooling heat sources disposed thereon less than heat sources disposed at the interior region of the heat sink thus maintaining the heat sources disposed on the heat sink proximate the edges thereof at approximately the same temperature as the heat sources disposed on the interior region of the heat sink;
at least two cooling manifolds which receive the transmit/receive multichannel module; and
an array plate which receives the at least two manifolds.

32. A transmit/receive integrated multichannel module for use in phased array radar systems comprising:
a cold plate having opposing aluminum skins;
edge mounted and inwardly mounted power amplifiers disposed on one said skin;

a core layer sandwiched between the opposing aluminum skins, the core layer including graphite surrounded by an aluminum body, the aluminum body including inwardly directed tabs extending from opposing cooled edges of the cold plate, the inwardly directed tabs having orifices therethrough, one said opposing aluminum skin also having cooled edge located orifices therethrough aligned with the orifices in the tabs to reduce the conductivity of the cooled edges of the cold plate thus reducing the temperature gradient between the edge mounted heat sources on said skin and the inwardly mounted heat sources on said skin without adversely effecting the structural integrity of the graphite core layer;

a frame extending from the cold plate, the frame including:
  a power/logic CCA mounted adjacent the control module;
  a DC/DC converter disposed adjacent to the power logic CCA;
  an EMI filter CCA mounted on a distal end of the frame from the cold plate and adjacent to the DC/DC converter;
  an I/O connector connected to the EMI filter; and
  a plurality of cooling contacts on the frame.

* * * * *